(12) United States Patent
Mukae

(10) Patent No.: US 8,288,919 B2
(45) Date of Patent: Oct. 16, 2012

(54) VIBRATORY ACTUATOR

(75) Inventor: Hideaki Mukae, Hyogo (JP)

(73) Assignee: Panasonic Corporation, Osaka (JP)

( * ) Notice: Subject to any disclaimer, the term of this patent is extended or adjusted under 35 U.S.C. 154(b) by 298 days.

(21) Appl. No.: 12/843,362

(22) Filed: Jul. 26, 2010

(65) Prior Publication Data

US 2011/0018394 A1 Jan. 27, 2011

(30) Foreign Application Priority Data

Jul. 27, 2009 (JP) ................................. 2009-174217

(51) Int. Cl.
*H02N 2/00* (2006.01)

(52) U.S. Cl. ......... 310/323.16; 310/323.01; 310/323.02; 310/328

(58) Field of Classification Search ............. 310/323.01, 310/323.02, 323.04, 323.05, 323.09, 323.13, 310/323.14, 323.16, 323.17, 328
See application file for complete search history.

(56) References Cited

U.S. PATENT DOCUMENTS

| 5,191,688 | A | * | 3/1993 | Takizawa et al. | ............ | 29/25.35 |
|---|---|---|---|---|---|---|
| 6,242,846 | B1 | | 6/2001 | Ashizawa et al. | | |
| 6,979,934 | B1 | * | 12/2005 | Wischnewskiy | ......... | 310/323.01 |
| 7,642,696 | B2 | * | 1/2010 | Mukae | ...................... | 310/323.01 |
| 2006/0202589 | A1 | * | 9/2006 | Kasai et al. | .............. | 310/323.13 |
| 2009/0224631 | A1 | * | 9/2009 | Mukae | ...................... | 310/323.16 |

FOREIGN PATENT DOCUMENTS

| JP | 11-346486 | 12/1999 |
|---|---|---|
| JP | 2000-60163 | 2/2000 |

* cited by examiner

*Primary Examiner* — Thomas M Dougherty
(74) *Attorney, Agent, or Firm* — Renner, Otto, Boisselle & Sklar, LLP

(57) ABSTRACT

An ultrasonic actuator includes an actuator body; and driver elements for outputting drive force, which are provided to the actuator body. The ultrasonic actuator further includes a holder which is provided to the actuator body, and which protrudes outwardly beyond principal surfaces in a direction crossing the principal surfaces of the actuator body; two supports for supporting the holder; contact rubber blocks limiting displacement of the actuator body by contacting the principal surfaces of the actuator body. The actuator body is biased toward a movable body side. A long hole extending in a biasing direction of the actuator body and into which the holder is fitted is formed in the support. At least two contact rubber blocks contact the principal surfaces of the actuator body at different positions in a longitudinal direction of the actuator body.

5 Claims, 10 Drawing Sheets

VIBRATORY ACTUATOR

CROSS-REFERENCE TO RELATED APPLICATION

This application claims priority to Japanese Patent Application No. 2009-174217 filed on Jul. 27, 2009, and the disclosure of which including the specification, the drawings, and the claims is hereby incorporated by reference in its entirety.

BACKGROUND

The present disclosure relates to a vibratory actuator including an actuator body generating stretching and bending vibrations.

In recent years, as the vibratory actuator of this type, there is a vibratory actuator disclosed in, e.g., Japanese Patent Publication No. H11-346486. The vibratory actuator includes an actuator body generating stretching and bending vibrations. Driver elements orbiting in response to the stretching and bending vibrations of the actuator body are attached to the actuator body. The vibratory actuator is arranged so that the driver elements contact a relatively-movable member. The stretching and bending vibrations are generated in the actuator body in such a state to provide the orbit motion of the driver elements, thereby relatively moving one of the relatively-movable member and the vibratory actuator with respect to the remaining one of the relatively-movable member and the vibratory actuator. In such a state, in order to increase friction force between the driver elements and the relatively-movable member, the actuator body is biased toward the relatively-movable member.

A support configuration of the actuator body will be described in more detail below. Protrusions extending in a thickness direction of the actuator body are provided in the actuator body. The protrusions are supported by supports. Specifically, a long hole extending in a biasing direction of the actuator body is formed in the support. The protrusion is fitted into the long hole of the support, and is slidable along an edge of the long hole. That is, the actuator body is supported by the supports so as to be slidable in the biasing direction.

SUMMARY

However, in the configuration in which the actuator body is supported with a certain degree of freedom, there is a possibility that noise is generated when vibrating the actuator body. For example, there is a minute clearance between the long hole of the support and the protrusion of the actuator body, which allows the slide of the protrusion. Thus, when vibrating the actuator body, the protrusion may hit a wall surface of the long hole to generate noise. Further, when vibrating the actuator body, the actuator body may hit members arranged therearound (e.g., a case in which the actuator body is accommodated and the supports) to generate noise.

The present disclosure has been made in view of the foregoing, and it is an object of the present disclosure to reduce noise when operating the vibratory actuator.

In a vibratory actuator which is movable relative to a relatively-movable member, the vibratory actuator includes an actuator body having a pair of principal surfaces facing each other, and generating stretching vibration in a longitudinal direction of the principal surface and bending vibration in a lateral direction of the principal surface; driver elements provided to the actuator body, and outputting drive force by generating orbit motion in response to the vibrations of the actuator body; protrusions provided to the actuator body, and protruding outwardly beyond the principal surfaces in a direction crossing the principal surfaces; two supports for supporting the protrusions; and contact bodies contacting one of the principal surfaces of the actuator body, and limiting displacement of the actuator body in the direction crossing the principal surfaces. The actuator body is biased toward the relatively-movable member. A long hole extending in a biasing direction of the actuator body and into which the protrusion is fitted is formed in the support. At least two contact bodies contact the principal surface of the actuator body at different positions in the longitudinal direction.

According to the vibratory actuator, the noise when operating the ultrasonic actuator can be reduced.

BRIEF DESCRIPTION OF THE DRAWINGS

FIG. 9(A) illustrates a state before the driving; FIG. 9(B) illustrates a state in which the actuator body is expanded in the longitudinal direction to drive the stage by one of driver elements; and FIG. 9(C) illustrates a state in which the actuator body is contracted in the longitudinal direction to drive the stage by the other driver element.

DETAILED DESCRIPTION

Examples of embodiments of the present disclosure will be described in detail hereinafter with reference to the drawings.

<<Embodiment>>

Figure 1:
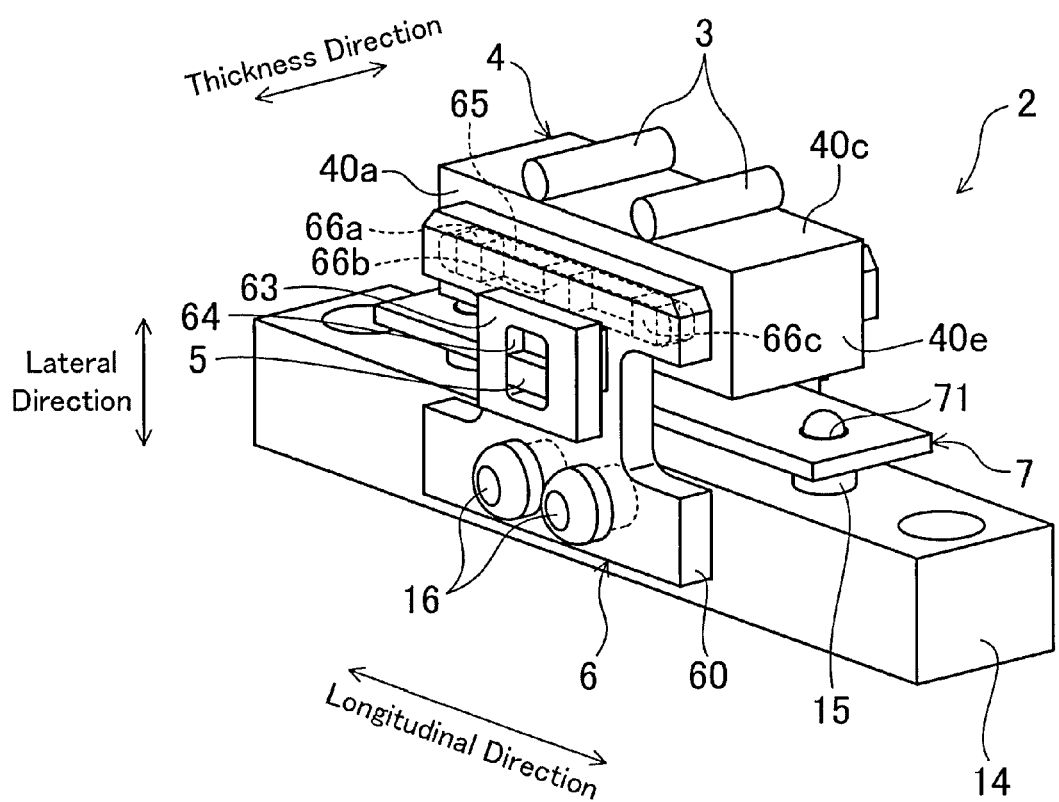
FIG. 1 is a perspective view of an ultrasonic actuator.
Figure 2:
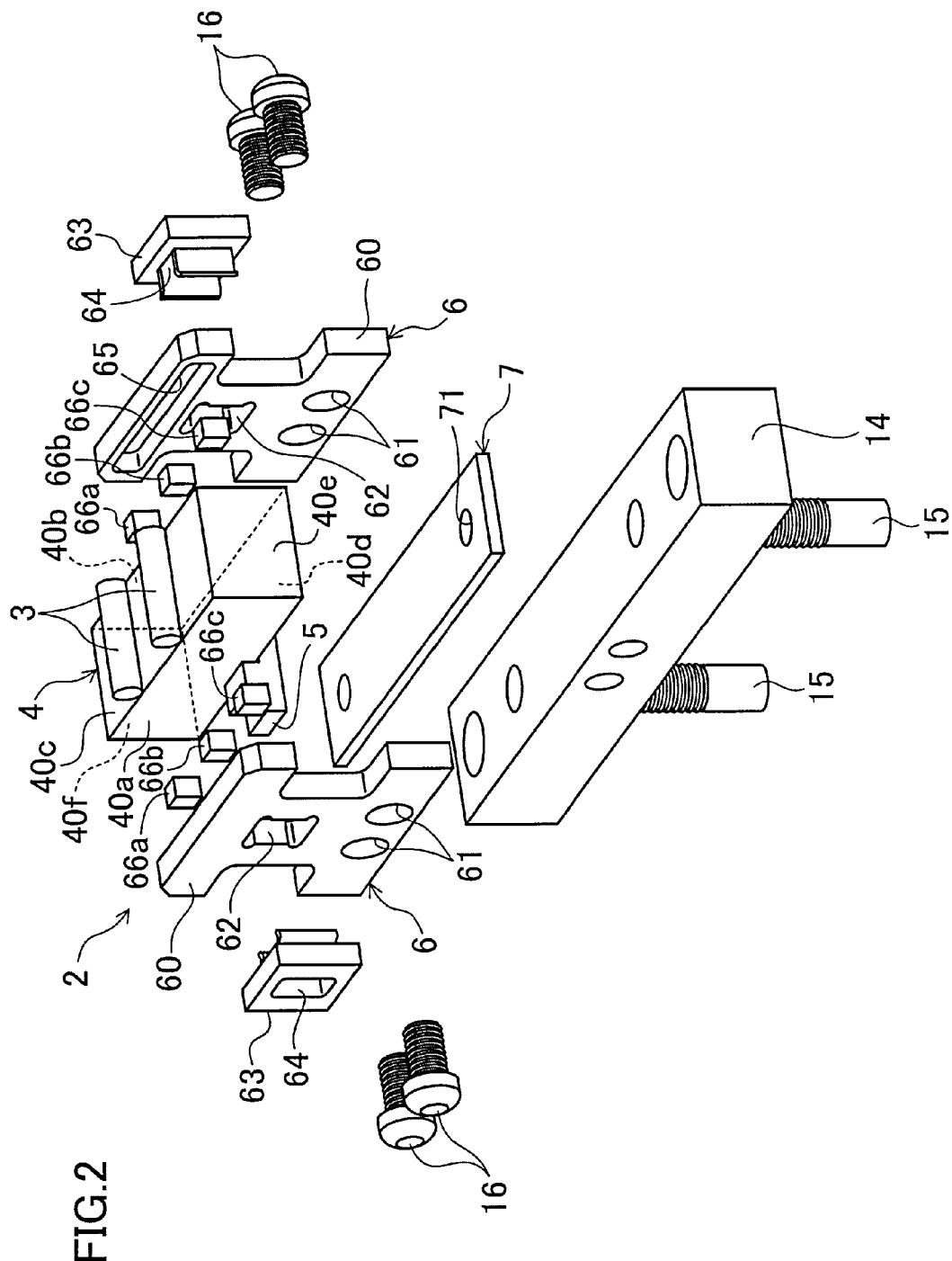
FIG. 2 is an exploded perspective view of an ultrasonic actuator of an embodiment of the present disclosure.
Figure 3:
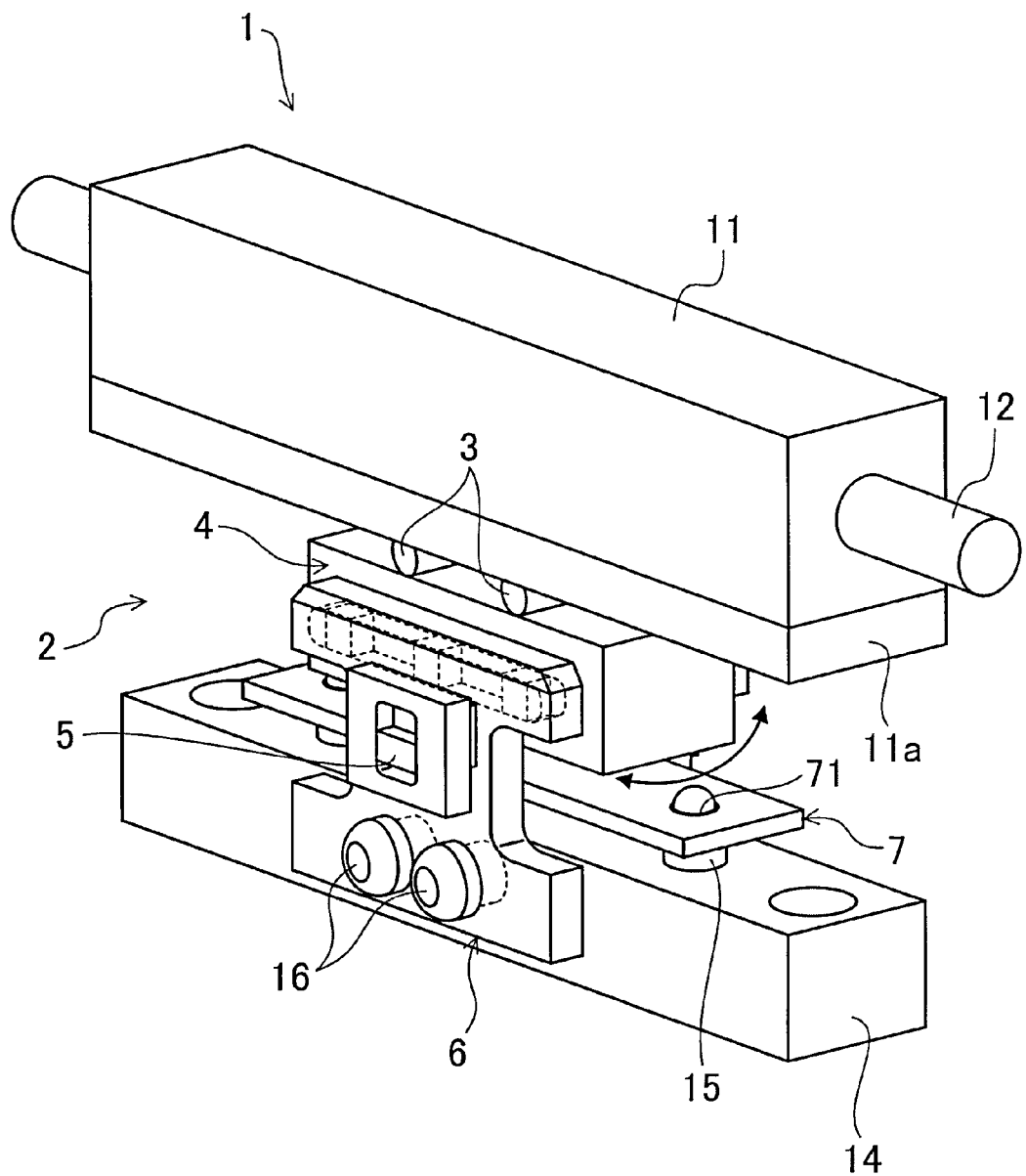
FIG. 3 is a perspective view of a drive unit.

FIG. 1 is a perspective view of an ultrasonic actuator of an embodiment of the present disclosure; FIG. 2 is an exploded perspective view of the ultrasonic actuator; and FIG. 3 is a perspective view of a drive unit in which the ultrasonic actuator is installed. A drive unit 1 includes an ultrasonic actuator 2 for outputting drive force by vibration; a movable body 11 which can move along a guide 12; and a control unit (not shown in the figure) for driving and controlling the ultrasonic actuator 2. The drive unit 1 is for driving the movable body 11 by the ultrasonic actuator 2. The ultrasonic actuator 2 serves as a vibratory actuator, and the movable body 11 serves as a relatively-movable member.

The movable body 11 is slidably attached to the guide 12 fixed on a base (not shown in the figure) which is a fixed body. This allows the movable body 11 to move along a direction in which the guide 12 extends. The direction in which the guide 12 extends is a movable direction of the movable body 11. A slide plate 11a made of alumina is bonded to a bottom surface of the movable body 11. Material of the slide plate 11a is not limited to alumina, and the slide plate 11a may be formed by using any material. The ultrasonic actuator 2 is arranged on the base so that driver elements 3 (described later) contact the slide plate 11a bonded to the movable body 11.

The ultrasonic actuator 2 outputs the drive force to the movable body 11 in order to relatively move the movable body 11 with respect to the ultrasonic actuator 2. The ultrasonic actuator 2 includes an actuator body 4 generating vibration, the driver elements 3 attached to the actuator body 4 to transmit the drive force of the actuator body 4 to the movable body 11; a holder 5 for holding the actuator body 4; supports 6 for supporting the holder 5; and a plate spring 7 for biasing the actuator body 4 toward the movable body 11.

The actuator body 4 includes piezoelectric elements. As illustrated in FIG. 2, the actuator body 4 is substantially in the form of a rectangular parallelepiped, and has a pair of substantially rectangular principal surfaces 40a and 40b facing each other; a pair of long-side surfaces 40c and 40d facing each other and extending in a longitudinal direction of the principal surfaces 40a and 40b so as to be orthogonal to the principal surfaces 40a and 40b; and a pair of short-side surfaces 40e and 40f facing each other and extending in a lateral direction of the principal surfaces 40a and 40b so as to be orthogonal to both of the principal surfaces 40a and 40b and the long-side surfaces 40c and 40d.

Figure 4:
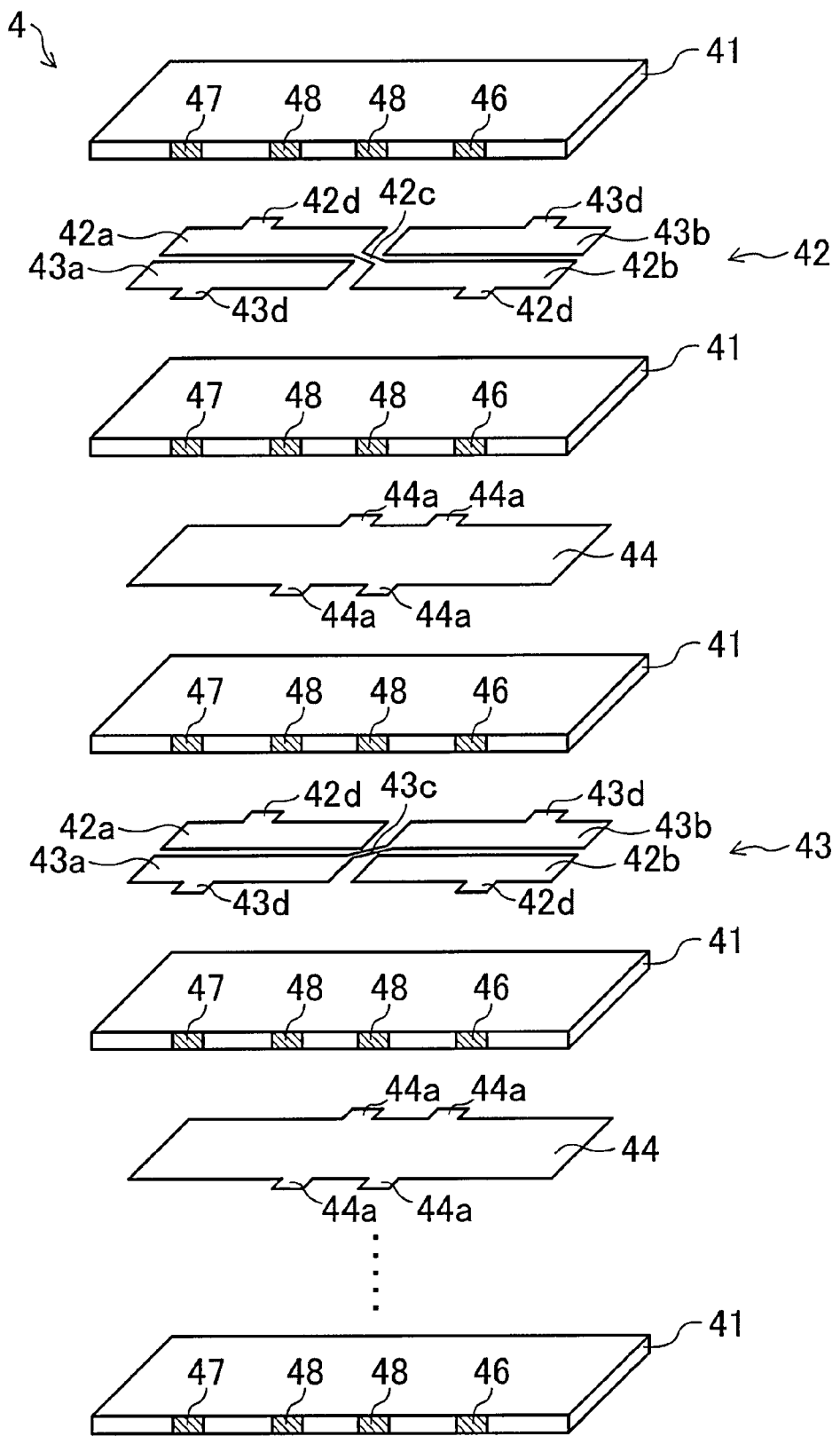
FIG. 4 is an exploded perspective view of a piezoelectric element unit.

FIG. 4 is an exploded perspective view of the actuator body 4. As illustrated in FIG. 4, the actuator body 4 is provided by alternately stacking piezoelectric layers (piezoelectric elements) 41 and internal electrode layers 42, 44, 43 and 44. The internal electrode layers 42, 44, 43 and 44 are a first power-feeding electrode layer 42, a common electrode layer 44, a second power-feeding electrode layer 43, and a common electrode layer 44, which are alternately stacked in this order with the piezoelectric layers 41 being interposed therebetween. The first power-feeding electrode layer 42, the common electrode layer 44, the second power-feeding electrode layer 43, and the common electrode layer 44 are grouped as a single set, and a plurality of sets, each of which includes the internal electrode layers 42, 44, 43, and 44, are repeatedly stacked with the piezoelectric layers 41 being interposed therebetween. Note that the piezoelectric layers 41 are positioned at both ends of the actuator body 4 in the stacking direction. Each of the first power-feeding electrode layer 42, the second power-feeding electrode layer 43, and the common electrode layers 44 is printed on a principal surface of each of the piezoelectric layers 41.

Each of the piezoelectric layers 41 is an insulating layer made of ceramic such as lead zirconate titanate. As in the actuator body 4, the piezoelectric layer 41 is substantially in the form of a rectangular parallelepiped, and has a pair of principal surfaces; a pair of long-side surfaces; and a pair of short-side surfaces. Each of the long-side surfaces of the piezoelectric layer 41 is provided with first and second external electrodes 46 and 47 in both end portions in the longitudinal direction, and two common external electrodes 48 are formed on an inner side in the longitudinal direction with respect to the first and second external electrodes 46 and 47. That is, in each of the long-side surfaces of the piezoelectric layer 41, the first external electrode 46, the two common external electrodes 48, and the second external electrode 47 are arranged so as to be apart from each other in the longitudinal direction in this order.

Each of the common electrode layers 44 is substantially rectangular, and covers almost all the principal surface area of the piezoelectric layer 41. Lead electrodes 44a are formed so as to extend from long-side sections of the common electrode layer 44 to the common external electrodes 48 formed in the long-side surfaces of the piezoelectric layer 41.

Figure 5:
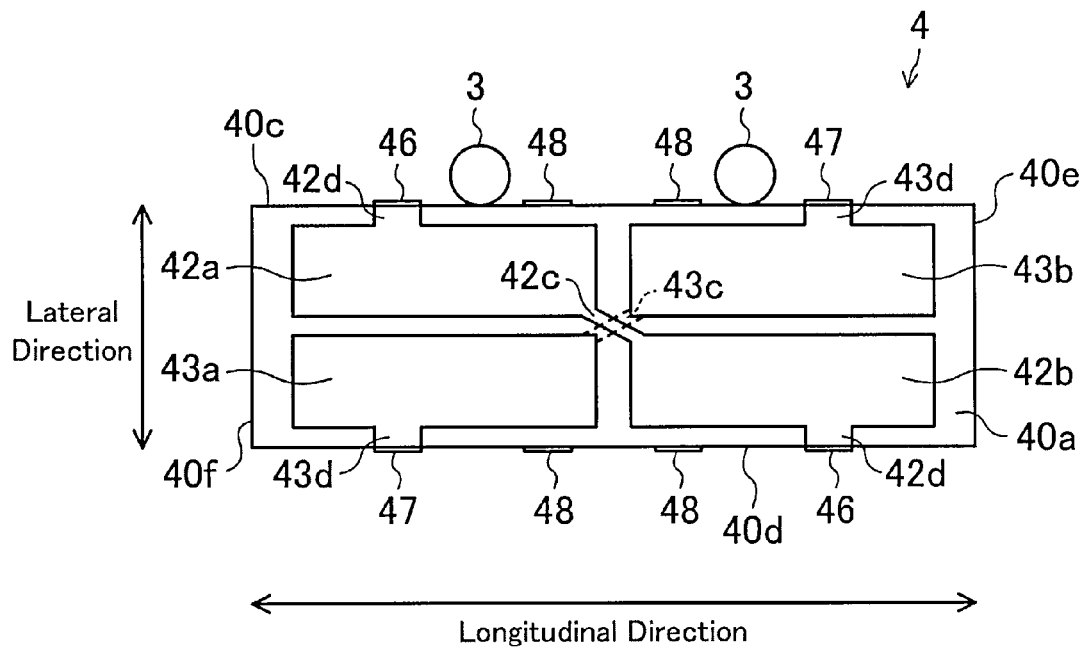
FIG. 5 is a front view schematically illustrating a configuration of an actuator body.

As illustrated in FIG. 5, the principal surface of the piezoelectric layer 41 is divided into quadrants, i.e., two areas in the longitudinal direction and two areas in the lateral direction. The first power-feeding electrode layer 42 includes a pair of first electrodes 42a and 42b respectively formed on one of pairs of diagonally-aligned areas of the principal surface, and the second power-feeding electrode layer 43 includes a pair of second electrodes 43a and 43b formed on the other pair of diagonally-aligned areas. The first electrodes 42a and 42b and the second electrodes 43a and 43b face the common electrode layer 44 with the piezoelectric layer 41 being interposed therebetween. Lead electrodes 42d are formed so as to extend from the first electrodes 42a and 42b to the first external electrodes 46 formed in adjacent portions of the long-side surfaces of the piezoelectric layer 41. Lead electrodes 43d are formed so as to extend from the second electrodes 43a and 43b to the second external electrodes 47 formed in adjacent portions of the long-side surfaces of the piezoelectric layer 41. In the first power-feeding electrode layer 42, the first electrodes 42a and 42b are placed in conduction through a first conduction electrode 42c. In addition, in the second power-feeding electrode layer 43, the second electrodes 43a and 43b are placed in conduction through a second conduction electrode 43c.

In each of the long-side surfaces 40c and 40d of the actuator body 4 provided by alternately stacking the piezoelectric layers 41 and the internal electrode layers 42, 44, 43 and 44, the common external electrodes 48 of the piezoelectric layers 41 are aligned in the stacking direction to function as a single external electrode. The lead electrodes 44a formed in the common electrode layers 44 are electrically connected to the common external electrodes 48. The common electrode layers 44 provided in the different piezoelectric layers 41 are placed in conduction through the common external electrodes 48.

In the similar manner, in each of the long-side surfaces 40c and 40d of the actuator body 4, the first external electrodes 46 of the piezoelectric layers 41 are aligned in the stacking direction to function as a single external electrode, and the second external electrodes 47 of the piezoelectric layers 41 are aligned in the stacking direction to function as a single external electrode. The lead electrodes 42d extending from the first electrodes 42a and 42b are electrically connected to the first external electrodes 46. In addition, the lead electrodes 43d extending from the second electrodes 43a and 43b are electrically connected to the second external electrodes 47. In this manner, the first electrodes 42a and 42b, and the first electrodes 42a and 42b provided in the different piezoelectric layers 41 are placed in conduction through the first conduction electrode 42c and the first external electrodes 46. In addition, the second electrodes 43a and 43b, and the second electrodes 43a and 43b provided in the different piezoelectric layers 41 are placed in conduction through the second conduction electrode 43c and the second external electrodes 47. Signal lines from the control unit are connected to the external electrodes 46, 47, and 48. Power is fed to the actuator body 4 through the external electrodes 46, 47, and 48.

Two driver elements 3 are attached to a long-side surface (i.e., one of a pair of surfaces facing each other along a direction of bending vibration (described later), which is hereinafter referred to as an "installation surface") 40c of the actuator body 4.

The driver elements 3 are cylindrical members, and are made of, e.g., zirconia, alumina, silicon nitride, silicon carbide, and tungsten carbide. The driver elements 3 are arranged so that an axial direction thereof is along a thickness direction of the actuator body 4. The driver elements 3 are attached to the installation surface 40c with adhesive so as to be in linear contact with the installation surface 40c. The adhesive is preferably softer than the material of the actuator body 4 and the material of the driver elements 3. Specifically, the adhesive includes, in particular, synthetic resin such as epoxy resin and silicone resin. Such material is used to possibly reduce interference with vibration (described later) of the actuator body 4, thereby ensuring fixing between the driver elements 3 and the installation surface 40c.

The driver elements 3 are attached to the installation surface 40c at a distance of 30-35% of the length of the installation surface 40c inwardly from both ends of the actuator body 4 in the longitudinal direction, i.e., at positions corresponding to antinodes of second-order bending vibration (described later) of the actuator body 4, where the maximum vibration occurs.

In the actuator body 4 configured as described above, the common external electrodes 48 are connected to ground to apply AC voltages having predetermined frequencies to the first and second external electrodes 46 and 47 with their phases being offset by 90°, thereby applying the AC voltages which are 90° out of phase with each other, to the pair of first electrodes 42a and 42b and the other pair of second electrodes 43a and 43b, which are positioned on the diagonal lines of the principal surface of the piezoelectric layer 41. Consequently, stretching vibration in the longitudinal direction of the actuator body 4 (i.e., a so-called "longitudinal" vibration) and bending vibration in the lateral direction (i.e., a so-called "lateral" vibration) are induced.

Figure 6:
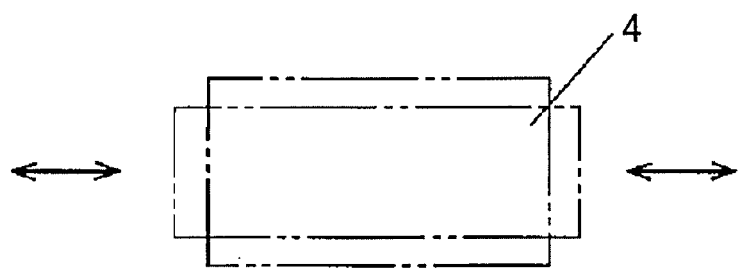
FIG. 6 is a conceptual diagram illustrating displacement of the actuator body in a longitudinal direction by first-order longitudinal vibration.

Resonance frequencies of the stretching and bending vibrations are determined by the actuator body 4, i.e., the material, shape, etc. of the actuator body 4. The resonance frequencies are also varied depending on force supporting the actuator body 4 and positions at which the actuator body 4 is supported. Considering the above-described conditions, the resonance frequencies are adjusted so as to be substantially equal to each other, and AC voltages having a frequency around the adjusted resonance frequency are applied to the first and second external electrodes 46 and 47 with their phases being offset by 90°. For example, if the shape etc. of the actuator body 4 is designed such that the first-order stretching vibration (see FIG. 5) and the second-order bending vibration (see FIG. 6) have the same resonance frequency, and AC voltages having a frequency around the resonance frequency are applied with their phases being offset by 90° as described above, the first-order stretching vibration and the second-order bending vibration occur in harmony in the actuator body 4. Thus, the shape of the actuator body 4 is varied in the order illustrated in FIGS. 8(A), 8(B), 8(C), and 8(D).

Figure 7:
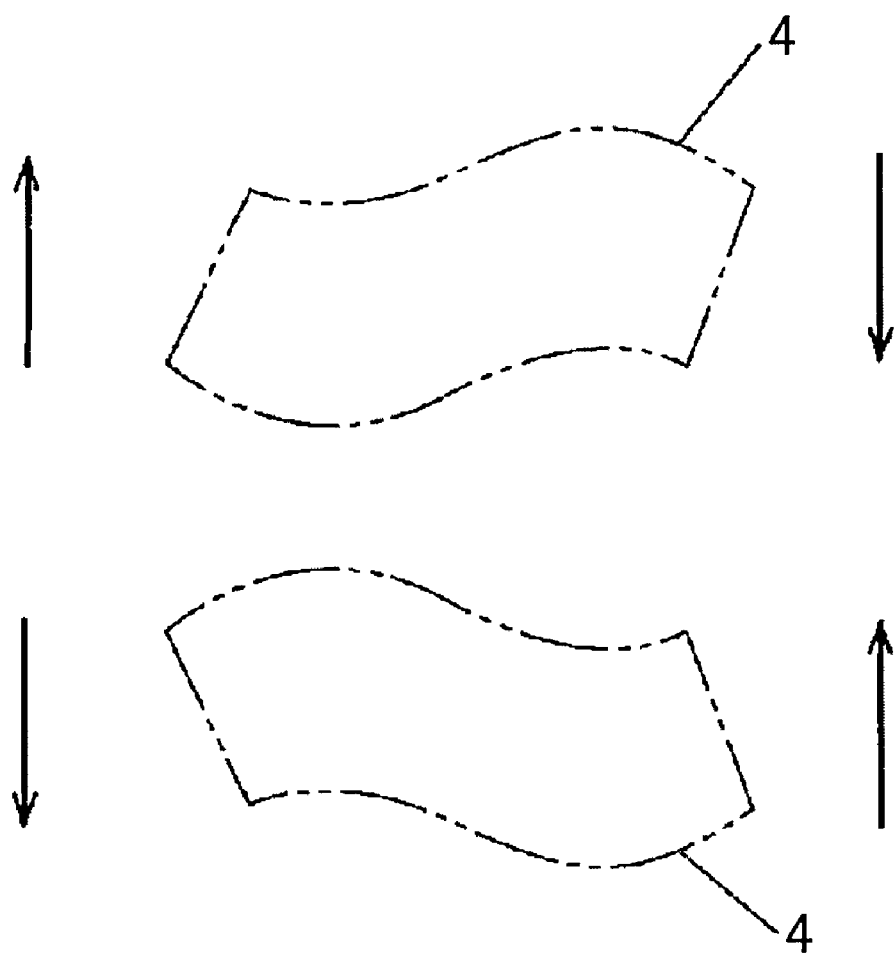
FIG. 7 is a conceptual diagram illustrating displacement of the actuator body by second-order bending vibration.
Figure 8A:
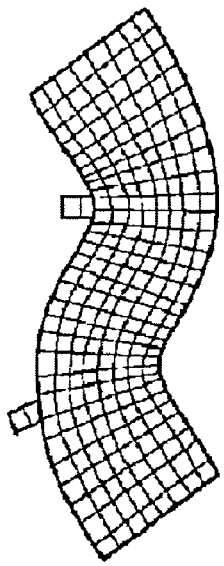
FIGS. 8(A)-(D) are conceptual diagrams illustrating an operation of the actuator body.
Figure 8B:
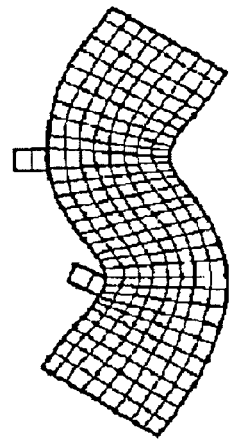
Figure 8C:
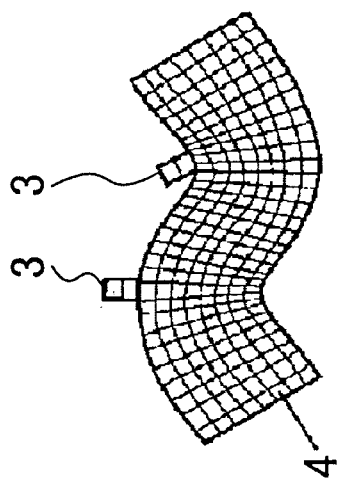
Figure 8D:
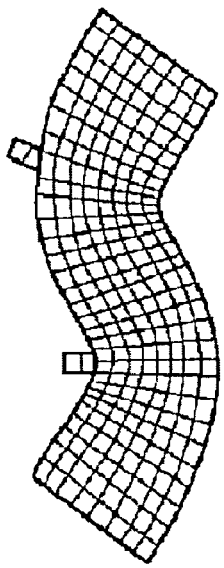

Consequently, the driver elements 3 attached to the actuator body 4 provide substantially elliptical motion, i.e., orbit motion, on a plane parallel to the principal surface of the actuator body 4 (a plane parallel to the plane of the page of FIG. 7), i.e., a plane containing the longitudinal and lateral directions (in other words, a plane containing directions of the stretching and bending vibrations).

The actuator body 4 configured as described above has a plurality of antinodes of vibration. The term "antinodes of vibration" refers to points where the maximum vibration displacement occurs. In the present embodiment, there are two antinodes of the longitudinal vibration positioned at the short-side surfaces of the actuator body 4. In addition, there are eight antinodes of the bending vibration including four antinodes at end portions of the long-side surface 40c of the actuator body 4, and at end portions of the long-side surface 40d; and four antinodes at a distance of 30-40% of the longitudinal length of the actuator body 4 inwardly from the end portions of the long-side surface 40c, and from the end portions of the long-side surface 40d. That is, in the ultrasonic actuator 2, there are ten antinodes of vibration including the antinodes of the stretching and bending vibrations. The driver elements 3 are attached to the installation surface 40c which is one of the long-side surfaces, at the points corresponding to the antinodes, i.e., at a distance of 30-35% of the length of the installation surface 40c inwardly from the both end portions in the longitudinal direction.

The holder 5 is made of polycarbonate (containing glass fibers). As illustrated in FIG. 2, the holder 5 is attached to the long-side surface 40d of the actuator body 4, to which the driver elements 3 are not attached. Specifically, at a center portion of the long-side surface 40d of the actuator body 4 in the longitudinal direction, the holder 5 is attached so as to sandwich the actuator body 4 in the thickness direction of the actuator body 4. The center portion of the long-side surface 40d of the actuator body 4 in the longitudinal direction is a portion corresponding to a node of the longitudinal vibration of the actuator body 4. In addition, the holder 5 protrudes outwardly beyond the principal surfaces of the actuator body 4, i.e., from two parallel plans including the principal surfaces, in the thickness direction of the actuator body 4. The holder 5 serves as protrusions.

The support 6 includes a support body 60 formed in a plate-like shape; and a guide member 63 provided to the support body 60. The supports 6 support the actuator body 4 through the holder 5. The support body 60 is attached to a base member 14 fixed to the base. Specifically, the support body 60 is made of, e.g., stainless or general steel. Two through-holes 61 are formed through the support body 60 in the thickness direction of the support body 60. The support body 60 is attached to the base member 14 with screws 16 inserted into the through-holes 61.

In addition, at the center of the support body 60, an opening 62 is formed through the support body 60 in the thickness direction of the support body 60. The guide member 63 for supporting the holder 5 is provided to the opening 62. The guide member 63 is bonded to the support body 60. A long hole 64 extending in a direction in which the actuator body 4 is biased toward the movable body 11 (i.e., the lateral direction of the actuator body 4) is formed through the guide member 63. The end portion of the holder 5, which protrudes in the thickness direction of the actuator body 4, is inserted into the long hole 64. The end portion of the holder 5 is slidable inside the long hole 64 in the extending direction of the long hole 64. The guide member 63 is made of material having lower elasticity modulus or lower hardness than that of the support body 60. In addition, the guide member 63 is made of material which is softer than the holder 5, and which has excellent sliding properties on resin. The guide member 63 is made of, e.g., polyacetal. Depending on the length of the protrusion of the holder 5, the long hole 64 may not penetrate the guide member 63, and may be formed in a shape with a bottom.

Further, in a surface of the support body 60, which faces the actuator body 4, an arrangement hole 65 is formed, in which three contact rubber blocks 66a, 66b, and 66c are arranged. The arrangement hole 65 is formed in a shape with a bottom, and extends in the longitudinal direction of the actuator body 4. In the support body 60, the arrangement hole 65 is formed on the opposite side of the through-holes 61 with respect to the opening 62. The contact rubber blocks 66 are made of silicone rubber. At approximately the center of the principal surface 40a (40b) of the actuator body 4 to be supported by the supports 6 in the lateral direction, the contact rubber blocks 66a, 66b, and 66c are arranged in approximately the longitudinal direction. The first and third contact rubber blocks 66a and 66c are arranged at a distance of approximately 13% of the longitudinal length inwardly from the both ends of the actuator body 4 in the longitudinal direction. The second contact rubber block 66b is arranged at approximately the center in the longitudinal direction of the actuator body 4. The points at a distance of approximately 13% of the length inwardly from the both ends of the actuator body 4 in the longitudinal direction, and the point at the center in the longitudinal direction correspond to the nodes of the second-order bending vibration of the actuator body 4. In addition, the point at the center of the actuator body 4 in the longitudinal direction corresponds to the node of the first-order stretching vibration of the actuator body 4. The arrangement hole 65 may not be a long hole. That is, the number of the arrangement hole(s) 65 can be selected based on the number of the contact rubber block(s) 66, and may be a hole having a size which allows the contact rubber blocks 66 to fit into the arrangement hole 65.

The contact rubber blocks 66a, 66b, and 66c contact the principal surfaces 40a and 40b of the actuator body 4 with the supports 6 supporting the actuator body 4. The contact rubber blocks 66a, 66b, and 66c have a function to restrict displacement of the actuator body 4 in a direction crossing the principal surfaces 40a and 40b.

The plate spring 7 is provided so as to face the long-side surface 40d of the actuator body 4, to which the holder 5 is attached. Specifically, the plate spring 7 is provided between the long-side surface 40d of the actuator body 4, to which the holder 5 is attached, and the base member 14. At both end portions of the plate spring 7 in the longitudinal direction, openings 71 are formed, into which the tips of screws 15 inserted into the base member 14 are fitted. Specifically, screw holes are formed through the base member 14 in a direction parallel to the lateral direction of the actuator body 4, and the screws 15 are inserted into the screw holes. The tips of the screws 15 protrude to the actuator body 4 side with respect to the base member 14. The tips of the screws 15 are fitted into the openings 71 of the plate spring 7. The plate spring 7 configured as described above contacts the holder 5 attached to the actuator body 4. That is, the screws 15 of the base member 14 protrude to the actuator body 4 side, thereby allowing the plate spring 7 to push the actuator body 4 toward the movable body 11 side through the holder 5.

Next, assembly of the ultrasonic actuator 2 will be described.

First, the holder 5 is bonded to the center portion of the long-side surface 40d of the actuator body 4 in the longitudinal direction, to which the driver elements 3 are not attached. In addition, the guide member 63 is bonded to the support body 60. Further, the contact rubber blocks 66a, 66b, and 66c are bonded to the arrangement hole 65 of the support body 60. Note that the contact rubber blocks 66a, 66b, and 66c are not necessarily bonded to the arrangement hole 65, but may be merely fitted into the arrangement hole 65.

Next, one of the supports 6 is attached to the base member 14 with the screws 16. Subsequently, by using jigs etc., the actuator body 4 is arranged at a predetermined distance from the base member 14, and one of the end portions of the holder 5 is inserted into the long hole 64 of the support 6 attached to the base member 14. Further, the long hole 64 of the other support 6 is fitted to the other end portion of the holder 5, and the other support 6 is attached to the base member 14 with screws 16. In such a state, the contact rubber blocks 66a, 66b, and 66c are sandwiched between each of the principal surfaces 40a and 40b of the actuator body 4 and each of the supports 6 to be compressed and deformed. For example, the contact rubber blocks 66a, 66b, and 66c are compressed by approximately 20%. Such an amount of compression corresponds an amount of deformation at which compression capability is ensured even when silicone rubber is plastically deformed under various environments. As described above, the other support 6 is attached to the base member 14 with the actuator body 4 being positioned with jigs etc., thereby precisely locating positions where the contact rubber blocks 66a, 66b, and 66c contact the actuator body 4.

Subsequently, the plate spring 7 is arranged between the actuator body 4 and the base member 14. The screws 15 are twisted into the screw holes of the base member 14, and the tips of the screws 15 are fitted into the openings 71 of the plate spring 7. By adjusting the length of the protrusions of the screws 15 from the base member 14, the plate spring 7 comes into contact with the holder 5.

The signal lines extending from the control unit are connected to the external electrodes 46, 47, and 48 of the ultrasonic actuator 2.

In the ultrasonic actuator 2 assembled as described above, the base member 14 is attached to the base with the driver elements 3 contacting the slide plate 11a of the movable body 11. Subsequently, the screws 15 are adjusted to push the holder 5 with the plate spring 7, thereby biasing the actuator body 4 toward the movable body 11. Consequently, the driver elements 3 are pressed against the movable body 11.

The assembly sequence of the ultrasonic actuator 2, which has been described above, is an example. As long as the ultrasonic actuator 2 can be assembled, the order of the assembly sequence may be changed. For example, the base member 14 may be attached to the base before the assembly of the ultrasonic actuator 2. In such a case, when the assembly of the ultrasonic actuator 2 is completed, the driver elements 3 contact the movable body 11.

An operation of the ultrasonic actuator 2 will be described hereinafter with reference to FIG. 9.

When receiving an operation command from an external unit, the control unit applies AC voltages having frequencies corresponding to the operation command, to the first and second external electrodes 46 and 47 so as to have a phase difference corresponding to the operation command. In this manner, the control unit harmonically generates the stretching and bending vibrations in the actuator body 4 to cause the driver elements 3 to orbit as illustrated in FIGS. 8A-8D, thereby moving the movable body 11. More specifically, the control unit applies AC voltages having frequencies slightly higher than a common resonance frequency for the stretching and bending vibrations of the actuator body 4, to the first and second external electrodes 46 and 47 in order to reduce or prevent abnormal heat generation in the actuator body 4. In such a state, the AC voltages are applied to the first and second external electrodes 46 and 47 with their phases being offset by 90°.

When generating composite vibration of the stretching and bending vibrations by the actuator body 4, the driver elements 3 provide the substantially elliptical motion in the plane containing the longitudinal and lateral directions of the actuator body 4. Thus, while the driver elements 3 periodically repeat an increase/decrease in friction force between the driver elements 3 and a contact surface of the movable body 11, the drive force of the actuator body 4 in the longitudinal direction is provided to the movable body 11 through the friction force, thereby moving the movable body 11 along the guide 12. The longitudinal direction of the actuator body 4 (direction coincident with the direction in which the guide 12 extends) is equivalent to a drive direction in which the driver elements 3 output the drive force.

Figure 9A:
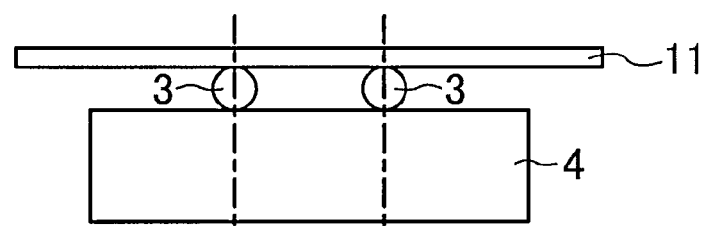
FIGS. 9(A)-(C) are conceptual diagrams illustrating driving of a stage by the ultrasonic actuator.
Figure 9B:
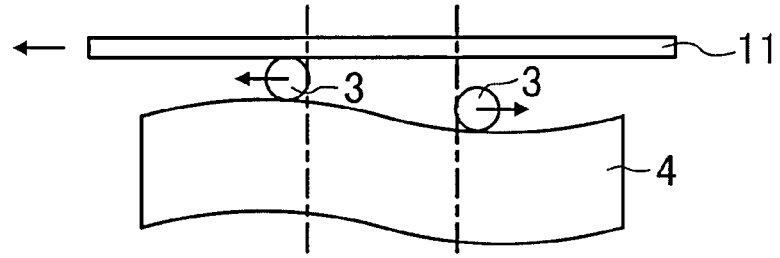

More specifically, when expanding the actuator body 4 in the stretching direction (direction of the longitudinal vibration), one of the driver elements 3 (e.g., the driver element 3 on the left side as viewed in FIG. 9) is displaced while increasing the friction force between the driver element 3 and the movable body 11 as compared to the friction force before the driving of the ultrasonic actuator 2 (i.e., the friction force in a state in which the driver elements 3 simply contact the movable body 11) as illustrated in FIG. 9(B). Thus, such friction force moves the movable body 11 toward a side to which the one of the driver elements 3 is displaced in the longitudinal direction (the left side as viewed in FIG. 9). In such a state, the other driver element 3 (the driver element 3 on the right side as viewed in FIG. 9) is oppositely displaced from the former driver element 3 in the longitudinal direction. However, such a driver element 3 is displaced apart from the movable body 11, or is displaced while decreasing the friction force between the driver element 3 and the movable body 11 as compared to the friction force before the driving of the ultrasonic actuator 2. Thus, the latter driver element 3 has little effect on the movement of the movable body 11.

Figure 9C:
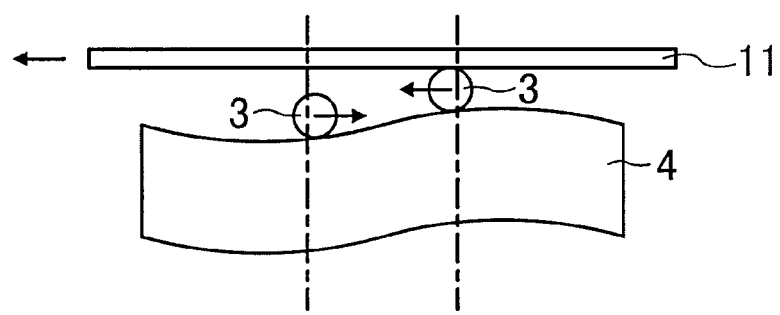

On the other hand, when contracting the actuator body 4 in the longitudinal direction, the latter driver element 3 (the driver element 3 on the right side as viewed in FIG. 9) is displaced while increasing the friction force between the driver element 3 and the movable body 11 as compared to the friction force before the driving of the ultrasonic actuator 2 (i.e., the friction force in the state in which the driver elements 3 simply contact the movable body 11) as illustrated in FIG. 9(C). Thus, such friction force moves the movable body 11 toward a side to which the latter driver element 3 is displaced in the longitudinal direction (the left side as viewed in FIG. 9). Such a movement direction is the same as the above-described movement direction of the movable body 11 by the latter driver element 3 when expanding the actuator body 4. In such a state, the former driver element 3 (the driver element 3 on the left side as viewed in FIG. 9) is oppositely displaced from the latter driver element 3 in the longitudinal direction. However, such a driver element 3 is displaced apart from the movable body 11, or is displaced while decreasing the friction force between the driver element 3 and the movable body 11 as compared to the friction force before the driving of the ultrasonic actuator 2. Thus, the former driver element 3 has little effect on the movement of the movable body 11.

In FIG. 9, the driver element 3 having no effect on the movement of the movable body 11 is apart from the movable body 11, but is not necessarily apart from the movable body 11. That is, the driver element 3 may contact the movable body 11 with the friction force which does not allow the movement of the movable body 11.

As described above, the driver elements 3 alternately move the movable body 11 in a predetermined direction with their phases being offset by 180°. The AC voltages are applied to the first and second external electrodes 46 and 47 with their phases being offset by −90° to reverse the direction of the drive force output from the driver elements 3, thereby allowing the movable body 11 to move in the other direction.

In the ultrasonic actuator 2, when vibrating the actuator body 4 to output the drive force, vibration swinging the actuator body 4 about an axis extending in approximately the lateral direction of the actuator body 4 (vibration swinging the actuator body 4 in a direction indicated by an arrow in FIG. 3) may be generated due to generation of natural vibration other than the first-order stretching vibration and the second-order bending vibration, and limitation of the movement of the actuator body 4 in the contact portions between the driver elements 3 and the movable body 11 and the contact portion between the holder 5 and the plate spring 7 and the like. Although the holder 5 attached to the actuator body 4 is fitted into the long holes 64 of the supports 6, clearance which allow the slide of the holder 5 are formed between the holder 5 and the long holes 64. Thus, when swinging the actuator body 4 about the axis extending in approximately the lateral direction, there are possibilities that the holder 5 attached to the actuator body 4 repeatedly hits wall surfaces of the long holes 64 formed in the guide members 63, and the actuator body 4 repeatedly hits the supports 6. In the present embodiment, the contact rubber blocks 66*a*, 66*b*, and 66*c* are provided. Thus, the swing of the actuator body 4 about the axis extending in approximately the lateral direction is attenuated by elastically deforming the contact rubber blocks 66*a*, 66*b*, and 66*c*. Further, not only such swing but also the movement of the actuator body 4 in the direction crossing the principal surfaces 40*a* and 40*b* can be absorbed by elastically deforming the contact rubber blocks 66*a*, 66*b*, and 66*c*. Consequently, noise generation due to the hit of the holder 5 to the wall surfaces of the long holes 64, and the hit of the actuator body 4 to the supports 6 can be reduced.

Thus, according to the present embodiment, at least two contact rubber blocks 66 contacting the principal surface 40*a* (40*b*) of the actuator body 4 at different points in the longitudinal direction are provided, thereby reducing noise when operating the ultrasonic actuator 2. That is, the contact rubber blocks 66 contact the principal surfaces 40*a* and 40*b* of the actuator body 4 with the actuator body 4 being supported by the supports 6, thereby reducing the displacement of the actuator body 4 in the direction crossing the principal surfaces 40*a* and 40*b*. Further, in each of the principal surfaces 40*a* and 40*b*, a plurality of contact rubber blocks 66 are provided at different points in the longitudinal direction, thereby reducing the swing of the actuator body 4 about the axis extending in approximately the lateral direction. This reduces the repeated hit of the holder 5 attached to the actuator body 4, to the guide members 63 of the supports 6, and the repeated hit of the actuator body 4 to the supports 6. In this manner, the noise when operating the ultrasonic actuator 2 can be reduced.

The contact rubber blocks 66*a*, 66*b*, and 66*c* are arranged so as to be symmetric with respect to a line extending in the lateral direction at the center of the principal surface 40*a* (40*b*) in the longitudinal direction, and are arranged so as to be symmetric with respect to a line extending in the longitudinal direction at the center of the principal surface 40*a* (40*b*) in the lateral direction, thereby ensuring symmetric vibration of the actuator body 4. That is, in the portions of the actuator body 4, which contact the contact rubber blocks 66*a*, 66*b*, and 66*c*, the vibration is limited by the contact rubber blocks 66*a*, 66*b*, and 66*c*. Thus, the contact rubber blocks 66*a*, 66*b*, and 66*c* are arranged as described above, thereby arranging resistors to the vibration of the actuator body 4 so as to be symmetric with respect to lines extending in the directions of the stretching and bending vibrations, which pass through the center of gravity of the actuator body 4. Consequently, the symmetric vibration of the actuator body 4 can be ensured.

The contact rubber blocks 66*a*, 66*b*, and 66*c* are arranged at a distance of 13% of the length inwardly from the both ends of the actuator body 4 in the longitudinal direction, and at the center in the longitudinal direction, thereby reducing or preventing the interference with the vibration of the actuator body 4 by the contact rubber blocks 66*a*, 66*b*, and 66*c*. That is, the points at a distance of 13% of the length inwardly from the both ends of the actuator body 4 in the longitudinal direction correspond to nodes of the second-order bending vibration of the actuator body 4. The point at the center of the actuator body 4 in the longitudinal direction corresponds to the node of the first-order stretching vibration of the actuator body 4. That is, at such points, the stretching and bending vibrations is generated in the actuator body 4, resulting in little vibration of the actuator body 4. Thus, even if the contact rubber blocks 66a, 66b, and 66c are arranged at the above-described points of the actuator body 4, the contact rubber blocks 66a, 66b, and 66c hardly interfere with the vibration of the actuator body 4. Consequently, degradation of vibration efficiency of the actuator body 4 can be reduced or prevented.

The contact bodies contacting the principal surfaces 40a and 40b of the actuator body 4 are made of rubber, thereby reducing or preventing the degradation of vibration efficiency of the actuator body 4, and reducing generation of abrasion powder. That is, the contact rubber blocks 66a, 66b, and 66c can be elastically deformed in response to the vibration of the actuator body 4. Thus, as compared to a configuration in which the actuator body 4 is pressed with members having high rigidity so as not to be displaced, the actuator body 4 can freely vibrate. Consequently, the degradation of vibration efficiency of the actuator body 4 can be reduced or prevented. In addition, if the contact bodies are made of the members having high rigidity, the contact bodies are hardly deformed, and therefore the actuator body 4 vibrates while slidingly contacting the contact bodies. Thus, there is a possibility that abrasion powder of the actuator body 4 and the contact bodies is generated. On the other hand, the contact bodies are made of rubber, and therefore the contact rubber blocks 66a, 66b, and 66c are deformed in response to the vibration of the actuator body 4. Consequently, the contact rubber blocks 66a, 66b, and 66c and the actuator body 4 hardly slide, and the abrasion powder thereof is hardly generated. In this manner, the generation of the abrasion powder can be reduced.

The contact rubber blocks 66a, 66b, and 66c are sandwiched between the supports 6 and the principal surfaces 40a and 40b of the actuator body 4, thereby reducing the number of components. That is, the contact rubber blocks 66a, 66b, and 66c may be attached to members other than the supports 6 to contact the principal surfaces 40a and 40b of the actuator body 4. On the other hand, according to the present embodiment, the contact rubber blocks 66a, 66b, and 66c are sandwiched between the supports 6 for supporting the actuator body 4 and the actuator body 4, thereby realizing a configuration in which the contact rubber blocks 66a, 66b, and 66c come into contact with the principal surfaces 40a and 40b of the actuator body 4 with reducing the number of components. In addition, the assembly of the ultrasonic actuator 2 can be improved.

The guide member 63 is made of the material having the lower elasticity modulus than that of the support body 60, thereby reducing hitting noise of the holder 5 to the guide members 63. That is, since the support 6 is a member for supporting the actuator body 4, the support 6 requires a certain degree of strength and material having higher elasticity modulus or higher hardness. Thus, the support 6 includes separate bodies which are the support body 60 and the guide member 63. Consequently, the support body 60 can be made of the material having higher elasticity modulus to fulfill a function to support the actuator body 4 while the guide member 63 can be made of material having lower elasticity modulus than that of the support body 60 to reduce the hitting noise of the guide members 63 to the holder 5. That is, the support 6 includes the separate bodies which are the support body 60 and the guide member 63, thereby ensuring both of the support of the actuator body 4 and the reduction in hitting noise. Further, the guide member 63 is preferably made of material having lower hardness than that of the support body 60.

In order to reduce the hitting noise of the holder 5 to the guide members 63, the holder 5 may be fixed to the guide members 63. However, there is a possibility that, as the driver elements 3 are gradually abraded, the friction force between the driver elements 3 and the movable body 11 cannot be ensured regardless of the actuator body 4 being biased by the plate spring 7. In such a case, a drive efficiency of the ultrasonic actuator 2 is significantly degraded. That is, the long hole 64 is formed in the guide member 63, and this allows the holder 5 to slide in the long hole 64. Consequently, the friction force between the driver elements 3 and the movable body 11 is ensured, thereby maintaining the drive efficiency of the ultrasonic actuator 2. For the reasons described above, flexibility for absorbing an impact from the holder 5 and high slide properties for sliding the holder 5 are required for the guide member 63. In the present embodiment, the holder 5 is made of polycarbonate containing glass fibers, and the guide member 63 is made of polyacetal. However, it is not limited to the above.

<<Other Embodiments>>

Embodiments of the present disclosure may have the following configurations.

That is, the three contact rubber blocks 66 are provided to the principal surface 40a (40b), but it is not limited to the above. In order to reduce the swing of the actuator body 4 about the axis extending in approximately the lateral direction, at least two contact rubber blocks 66 may be provided at different positions in the longitudinal direction. For example, in the foregoing embodiment, any one of the contact rubber blocks 66a, 66b, and 66c may be omitted. In addition, the number of contact rubber blocks 66 and/or positions where the contact rubber blocks 66 are provided may be different between the principal surfaces 40a and 40b of the actuator body 4. However, the contact rubber blocks 66 are preferably arranged so as to be symmetric with respect to the lines extending in the directions of the stretching and bending vibrations, which pass through the center of gravity of the actuator body 4, considering the vibration efficiency of the actuator body 4. If, e.g., one of the contact rubber blocks 66 is omitted in the foregoing embodiment, the second contact rubber block 66b in the longitudinal direction of the actuator body 4 is preferably omitted.

The positions of the contact rubber blocks 66a, 66b, and 66c may not be limited to those in the foregoing embodiment. For example, in the foregoing embodiment, the three contact rubber blocks 66a, 66b, and 66c are provided at the center of the principal surface 40a (40b) of the actuator body 4 in the lateral direction, but it is not limited to the center in the lateral direction. Each of the contact rubber blocks 66a, 66b, and 66c may be arranged at a different position in the lateral direction. In addition, the contact rubber blocks 66a, 66b, and 66c may be provided at positions in the longitudinal direction, which are different from those in the foregoing embodiment.

In the foregoing embodiment, the contact rubber block is employed as the contact body, but it is not limited to the above. For example, steel balls may contact the principal surfaces 40a and 40b of the actuator body 4. The contact body is a member having higher rigidity and a smaller friction coefficient, such as steel balls, thereby reducing or preventing the interference with the vibration of the actuator body 4. However, the contact body is preferably made of rubber in order not to generate the abrasion powder.

The holder 5 protrudes outwardly beyond the principal surfaces of the actuator body 4 in the thickness direction of the actuator body 4, but it is not limited to the above. For example, the holder 5 may protrude in the direction crossing the principal surfaces 40a and 40b of the actuator body 4, e.g., may extend in a direction inclined to the thickness direction. The holder 5 is attached to the long-side surface 40d of the actuator body 4, but it is not limited to the above. The holder 5 may be provided so as to penetrate the actuator body 4 in the direction crossing the principal surfaces 40a and 40b. In addition, the holder 5 is not necessarily a single member. The holder 5 may include two members, and such members are provided so as to protrude outwardly beyond the principal surfaces 40a and 40b of the actuator body 4, respectively.

The ultrasonic actuator 2 generates the first-order stretching vibration and the second-order bending vibration in the actuator body 4, but it is not limited to the above. As long as the stretching and bending vibrations can be generated in the actuator body 4, an actuator body generating any order of vibration may be employed.

In the foregoing embodiment, the ultrasonic actuator 2 moves the movable body 11, but it is not limited to the above. For example, the ultrasonic actuator 2 may be attached to the movable body 11 with the driver elements 3 contacting the base member 14. In such a configuration, the actuator body 4 vibrates to generate the orbit motion of the driver elements 3, thereby moving the movable body 11 to which the ultrasonic actuator 2 is attached, with respect to the base member 14. That is, in such a configuration, not the movable body 11 but the base member 14 serves as the relatively-movable member which relatively moves with respect to the ultrasonic actuator 2.

In the foregoing embodiment, the actuator body 4 includes the piezoelectric elements, but it is not limited to the above. For example, the actuator body 4 may be a resonator including piezoelectric elements attached to a metal elastic body.

Figure 10:
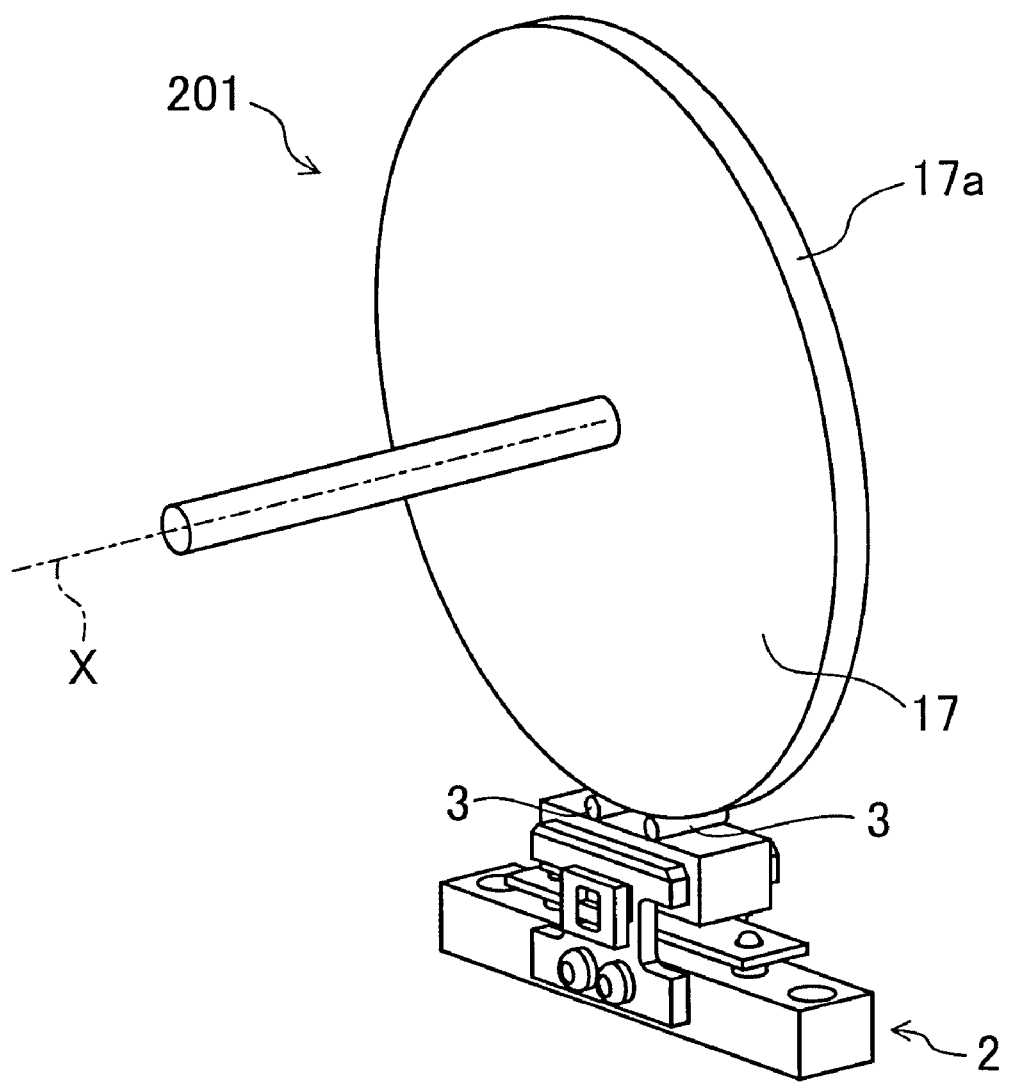
FIG. 10 is a perspective view of a drive unit of another embodiment.
Figure 11:
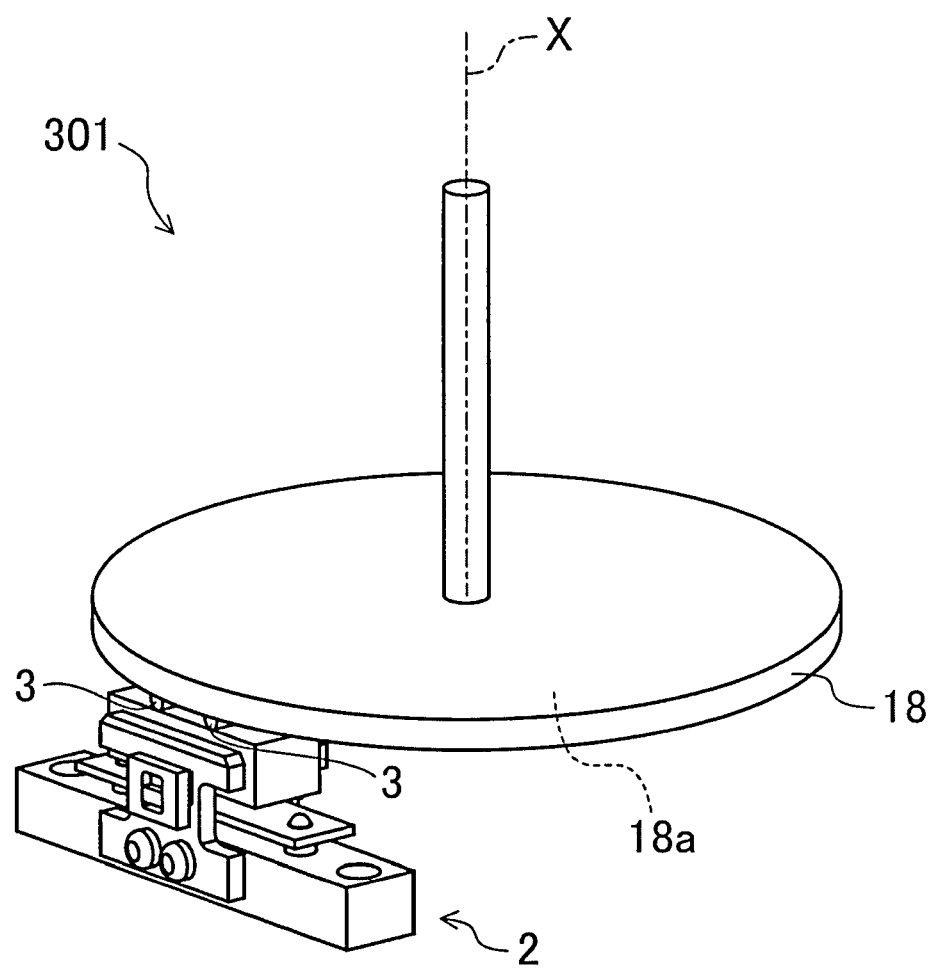
FIG. 11 is a perspective view of a drive unit of another embodiment.

In the foregoing embodiment, the movable body 11 which is the relatively-movable member driven by the drive force of the ultrasonic actuator is formed in the rectangular parallelepiped shape, but it is not limited to the above. Any configuration may be employed as the configuration of the relatively-movable member. As illustrated in, e.g., FIG. 10, a drive unit 201 may be employed, in which a movable body is a circular plate 17 which is rotatable about a predetermined axis X, and driver elements 3 of an ultrasonic actuator contact a circumferential surface 17a of the circular plate 17. In such a configuration, when driving the ultrasonic actuator, substantially elliptical motion of the driver elements 3 rotates the circular plate 17 about the predetermined axis X. In addition, as illustrated in FIG. 11, a drive unit 301 may be employed, in which a movable member is a circular plate 18 which is rotatable about a predetermined axis X, and driver elements 3 of an ultrasonic actuator contact a flat section 18a of the circular plate 18. In such a case, when driving the ultrasonic actuator, substantially elliptical motion of the driver elements 3 drives the circular plate 18 in a tangential direction of portions contacting the driver elements 3, resulting in an rotation of the circular plate 18 about the predetermined axis X.

As described above, the present disclosure is useful for the vibratory actuator including the actuator body generating the stretching and bending vibrations.

The description of the embodiments of the present disclosure is given above for the understanding of the present disclosure. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A vibratory actuator which is movable relative to a relatively-movable member, the vibratory actuator comprising:
an actuator body having a pair of principal surfaces facing each other, and generating stretching vibration in a longitudinal direction of the principal surface and bending vibration in a lateral direction of the principal surface;
driver elements provided to the actuator body, and outputting drive force by generating orbit motion in response to the vibrations of the actuator body;
protrusions provided to the actuator body, and protruding outwardly beyond the principal surfaces in a direction crossing the principal surfaces;
two supports for supporting the protrusions; and
contact bodies contacting one of the principal surfaces of the actuator body, and limiting displacement of the actuator body in the direction crossing the principal surfaces,
wherein
the actuator body is biased toward the relatively-movable member;
a long hole extending in a biasing direction of the actuator body and into which the protrusion is fitted is formed in the support; and
at least two contact bodies contact the principal surface of the actuator body at different positions in the longitudinal direction.

2. The vibratory actuator of claim 1, wherein the contact bodies contact at least points corresponding to nodes of the bending vibration of the actuator body.

3. The vibratory actuator of claim 1, wherein the contact body is an elastic body.

4. The vibratory actuator of claim 1, wherein the contact bodies are sandwiched between the support and the actuator body.

5. The vibratory actuator of claim 1, wherein the support includes a support body, and a guide member having the long hole, which is attached to the support body; and
the guide member has lower elasticity modulus than that of the support body.

* * * * *